United States Patent [19]
Yamakoshi

[11] Patent Number: 6,166,965
[45] Date of Patent: Dec. 26, 2000

[54] SEMICONDUCTOR MEMORY DEVICE HAVING PUSH-PULL TYPE OUTPUT CIRCUIT FORMED BY TWO N-CHANNEL MOS TRANSISTORS

[75] Inventor: Hiroyuki Yamakoshi, Kanagawa, Japan

[73] Assignee: NEC Corporation, Japan

[21] Appl. No.: 09/431,334

[22] Filed: Oct. 28, 1999

[30] Foreign Application Priority Data

Oct. 30, 1998 [JP] Japan .................. 10-309683

[51] Int. Cl.[7] .................................................. G11C 16/04
[52] U.S. Cl. ........................ 365/189.05; 365/189.11; 365/226
[58] Field of Search ................. 365/189.05, 189.11, 365/226, 230.06, 230.08

[56] References Cited

U.S. PATENT DOCUMENTS 5,903,501 5/1999 Kurosaki ........................ 365/189.05

FOREIGN PATENT DOCUMENTS 7-45067 2/1995 Japan .

*Primary Examiner*—David Nelms
*Assistant Examiner*—David Lam
*Attorney, Agent, or Firm*—Hayes, Soloway, Hennessey, Grossman & Hage, P.C.

[57] ABSTRACT

In a semiconductor memory device including a data bus, a data bus charging circuit for charging the data bus, a data bus discharging circuit for discharging the data bus in accordance with a cell read data signal, and a push-pull type output circuit formed by a first N-channel MOS transistor connected between a first power supply terminal and an output terminal and a second N-channel MOS transistor connected between the output terminal and a second power supply terminal, a step-up circuit is connected between the data bus and a gate of the first N-channel MOS transistor to generate a step-up voltage in accordance with a voltage at the data bus.

11 Claims, 15 Drawing Sheets

Fig. 1  PRIOR ART
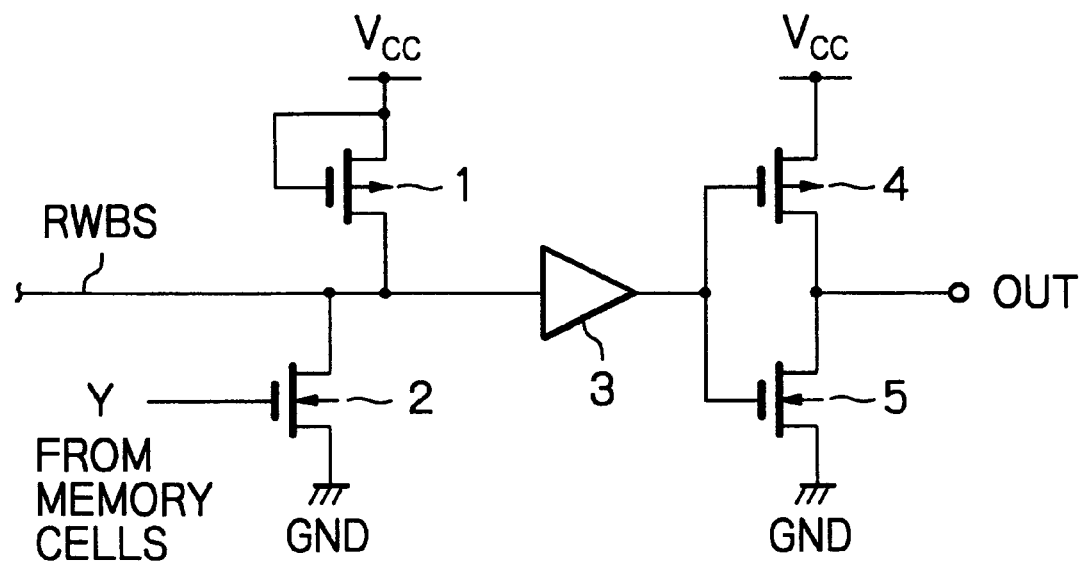
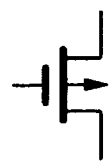 P-CHANNEL MOS TRANSISTOR
 N-CHANNEL MOS TRANSISTOR Fig. 6A S1
Fig. 6B S5
Fig. 6C S6
Fig. 6D S3

SEMICONDUCTOR MEMORY DEVICE HAVING PUSH-PULL TYPE OUTPUT CIRCUIT FORMED BY TWO N-CHANNEL MOS TRANSISTORS

BACKGROUND OF THE INVENTION

1. Field of the Invention

The present invention relates to a semiconductor memory device, and more particulculy, to an improvement of the output circuit of a semiconductor memory device such as a synchronous dynamic random access memory (SDRAM) device.

2. Description of the Related Art

An output portion of a prior art semiconductor memory device is constructed by a data bus, a data bus charging circuit formed by a load transistor for charging the data bus, a data bus discharging circuit for discharging the data bus in accordance with a cell read data signal, a buffer connected to the data bus, and a CMOS push-pull type output circuit formed by a P-channel MOS transistor connected between a power supply terminal and an output terminal and an N-channel MOS transistor connected between the output terminal and a ground terminal. This will be explained later in detail.

In the above-described prior art semiconductor memory device, however, since the transistor of the push-pull type output circuit on the power supply terminal is of a P-channel type, the pulling up drive ability of this transistor is so small that the read operation speed is low. If the drive ability of this transistor is increased, the transistor has to be increased in size, which would increase the device in size.

Also, in the above-described semiconductor memory device, when the cell read data signal stays at the same data such as "1" for a plurality of cycles, the voltage at the output terminal repeats a high level and a low level, which would increase the power consumption.

Further, in the above-described semiconductor memory device, when the cell read data signal is high to turn ON the data bus charging circuit, the load transistor becomes in an ON-state, which also would increase the power consumption.

SUMMARY OF THE INVENTION

It is an object of the present invention to increase the read operation speed of a semiconductor memory device.

Another object is to reduce the power dissipation of the semiconductor memory device.

According to the present invention, in a semiconductor memory device including a data bus, a data bus charging circuit, for charging the data bus, a data bus discharging circuit for discharging the data bus in accordance with a cell read data signal, and a push-pull type output circuit formed by a first N-channel MOS transistor connected between a first power supply terminal and an output terminal and a second N-channel MOS transistor connected between the output terminal and a second power supply terminal, a step-up circuit is connected between the data bus and a gate of the first N-channel MOS transistor to generate a step-up voltage in accordance with a voltage at the data bus. Thus, since the transistor of the push-pull output circuit on the side of the first power supply terminal is of an N-channel type driven by the step-up circuit, the read operation speed can be increased.

Also, one or two latch circuits are provided to latch the voltage at the data bus, and the latched voltages are supplied to the step-up circuit and the transistor of the push-pull output circuit on the side of the second power supply terminal. Thus, when the cell read data signal stays at the same data for a plurality of cycles, the voltage at the output terminal also stays at the same level, which would reduce the power consumption.

Further, the data bus charging circuit is operated in accordance with a data bus charging pulse signal in synchronization with a clock signal. Thus, the power consumption of the data bus charging circuit can be reduced.

BRIEF DESCRIPTION OF THE DRAWINGS

The present invention will be more clearly understood from the description set forth below, as compared with the prior art, with reference to the accompanying drawings, wherein:

FIG. 1 is a circuit diagram illustrating a prior art semiconductor memory device;

DESCRIPTION OF THE PREFERRED EMBODIMENTS

Figure 2:
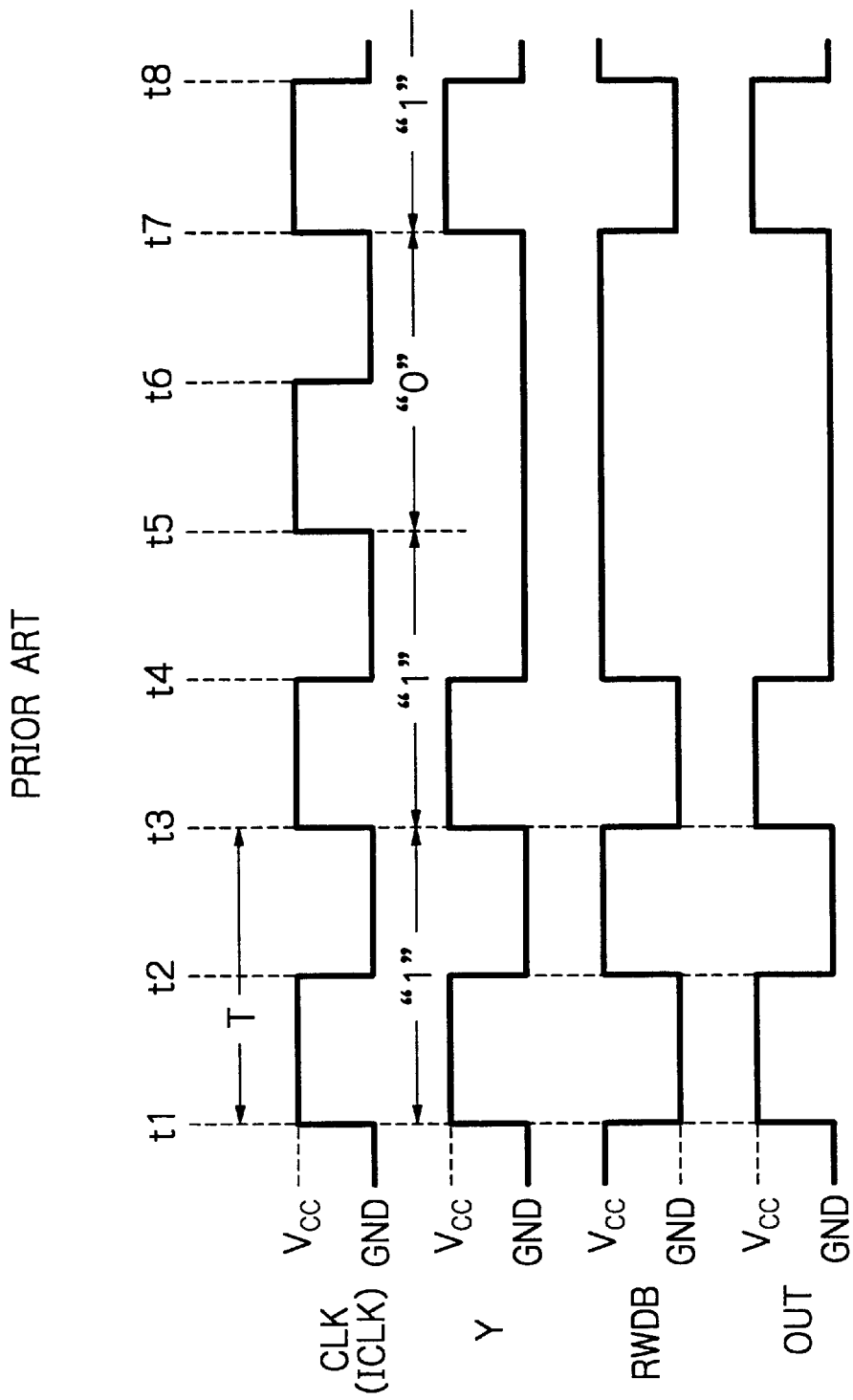
FIGS. 2A, 2B, 2C and 2D are timing diagrams for explaining the operation of the device of FIG. 1.

Before the description of the preferred embodiments, a prior art semiconductor memory device will be explained with reference to FIG. 1.

In FIG. 1, reference RWBS designates a data bus which is connected by an N-channel MOS load transistor 1 to a power supply terminal $V_{CC}$ whose voltage is also denoted by $V_{CC}$ and is connected by an N-channel MOS drive transistor 2 to a ground terminal GND whose voltage is also denoted by GND. That is, the transistor 1 charges the data bus RWBS and the transistor 2 discharges the data bus RWBS. Therefore, if a cell read data signal Y is low, the drive transistor 2 is turned OFF so that the voltage at the data bus RWBS is pulled up to $V_{CC}$ by the load transistor 1. On the other hand, if the cell read data signal Y is high, the load transistor 1 is turned ON to decrease the voltage at the data bus RWBS to GND.

The data bus RWBS is also connected via a buffer 3 to a push-pull type output circuit formed by a P-channel MOS transistor 4 and an N-channel MOS transistor 5. In this case, the transistor 4 is connected between the power supply terminal $V_{CC}$ and an output terminal OUT and the transistor 5 is connected between the output terminal OUT and the ground terminal GND.

The operation of the semiconductor memory device is explained next with reference to FIGS. 2A, 2B, 2C and 2D.

As shown in FIG. 2A, an external clock signal CLK or its internal clock signal ICLK in synchronization with the external clock signal CLK has a time period T. Also, a cell read data signal Y is read from one of the memory cells (not shown) in accordance with address information and a read mode signal (not shown), so that the cell read data signal Y is changed in synchronization with the clock signal CLK (or ICLK). For example, if cell read data is changed from "1" via "1" and "0" to "1", the cell read data signal Y is high (=$V_{CC}$) from time t1 to time t2, time t3 to time t4, and time t7 to time t8 as shown in FIG. 2B.

When the cell read data signal Y is high (=$V_{CC}$), the drive transistor 2 is turned ON, so that the voltage at the data bus RWBS is low (=GND) as shown in FIG. 2C. On the other hand, the cell read data signal Y is low (=GND), the drive transistor 2 is turned OFF, so that the load transistor 1 pulls up the voltage at the data bus RWBS to $V_{CC}$ as shown in FIG. 2C.

Also, when the voltage at the data bus RWBS is low (=GND), the transistors 4 and 5 are turned ON and OFF, respectively, so that the voltage at the output terminal OUT becomes high (=$V_{CC}$). On the other hand, when the voltage at the data bus RWBS is high (=$V_{CC}$), the transistors 4 and 5 are turned OFF and ON, respectively, so that the voltage at the output terminal OUT becomes low (=GND).

In the semiconductor memory device of FIG. 1, however, since the transistor 4 of the push-pull type output circuit on the power supply terminal $V_{CC}$ is of a P-channel type, the pulling up drive ability of the transistor 4 is so small that the read operation speed is low. If the drive ability of the transistor 4 is increased, the transistor 4 has to be increased in size, which would increase the device of FIG. 1 in size.

Also, in the semiconductor memory device of FIG. 1, when the clock signal CLK (or ICLK) is low (=GND), the voltage at the output terminal OUT is low (=GND) regardless of the cell read data signal Y. Therefore, when the cell read data signal Y stays at the same data such as "1" for a plurality of cycles, the voltage at the output terminal OUT repeats a high level and a low level for both halves of the time period T. In this case, the transistor 4 is often switched ON and OFF, which would increase the power consumption.

Further, in the semiconductor memory device of FIG. 1, when the cell read data signal Y is high (=$V_{CC}$), the load transistor 1 becomes in an ON-state for both halves of the time period T, which also would increase the power consumption.

Figure 3:
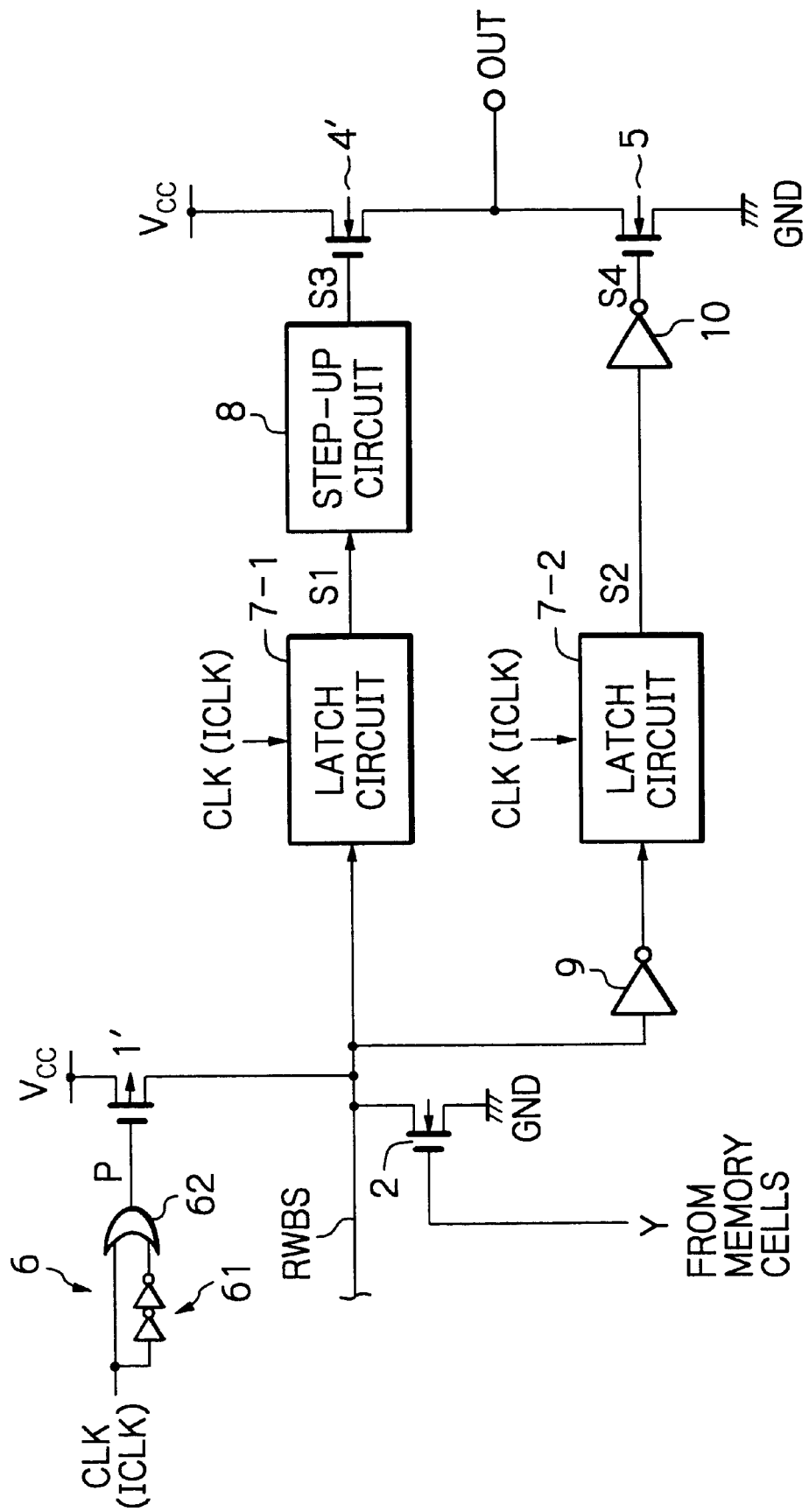
FIG. 3 is a circuit diagram illustrating a first embodiment of the semiconductor memory device according to the present invention.

In FIG. 3, which illustrates a first embodiment of the present invention, the N-channel transistor 1 of FIG. 1 is replaced by a P-channel MOS transistor 1' which is driven by a data bus charging pulse signal P generated from a data bus charging pulse generation 6. Also, the P-channel MOS transistor 4 of FIG. 1 is replaced by an N-channel MOS transistor 1'. Further, a latch circuit 7-1 and a step-up circuit 8 are connected in series between the data bus RWBS and the gate of the transistor 4', and an inverter 9, a latch circuit 7-2 and an inverter 10 are connected in series between the data bus RWBS and the gate of the transistor 5 of FIG. 1.

In FIG. 3, the buffer 3 of FIG. 1 is unnecessary, since the circuits 7-1, 8, 9, 7-2 and 10 serve as the buffer 3 of FIG. 1.

The data bus charging pulse signal generation circuit 6 is constructed by a delay circuit 61 and an OR circuit 62 to generate the data bus charging pulse signal P in synchronization with the clock signal CLK (or its internal clock signal ICLK).

The latch circuits 7-1 and 7-2 latch their input data in accordance with the clock signal CLK (or its internal clock signal ICLK).

Figure 4A:
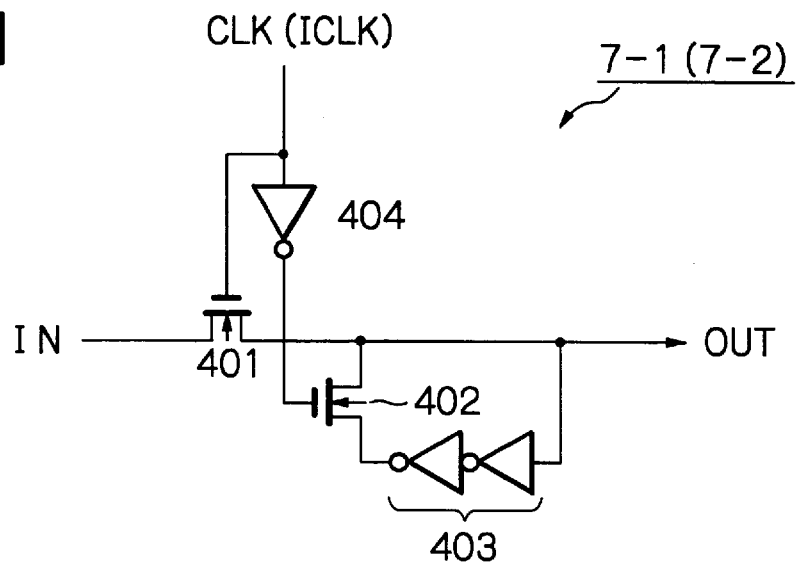
FIGS. 4A, 4B and 4C are circuit diagrams of the latch circuit of FIG. 3.

A first example of the latch circuits 7-1 and 7-2 is illustrated in FIG. 4A. That is, each of the latch circuits 7-1 and 7-2 is constructed by a transfer gate formed by an N-channel MOS transistor 401, a data holding circuit formed by an N-channel MOS transistor 402 and a buffer 403, and an inverter 404. In this case, the transistor 401 is driven directly by the clock signal CLK (or ICLK), and the transistor 402 is driven by the clock signal CLK (or ICLK) via the inverter 404. Therefore, if the clock signal CLK (ICLK) is high, the transistors 401 and 402 are turned ON and OFF, respectively, so that the latch circuit 7-1 (7-2) is in a through state by the ON-state transistor 401. On the other hand, if the clock signal CLK (ICLK) is low, the transistors 401 and 402 are turned OFF and ON, respectively, so that the latch circuit 7-1 (7-2) is in a data holding state by the feedback of the output data to the input data. As a result, input data is latched in the latch circuit 7-1 (7-2) in accordance with every falling edge of the clock signal CLK (ICLK).

Figure 4B:
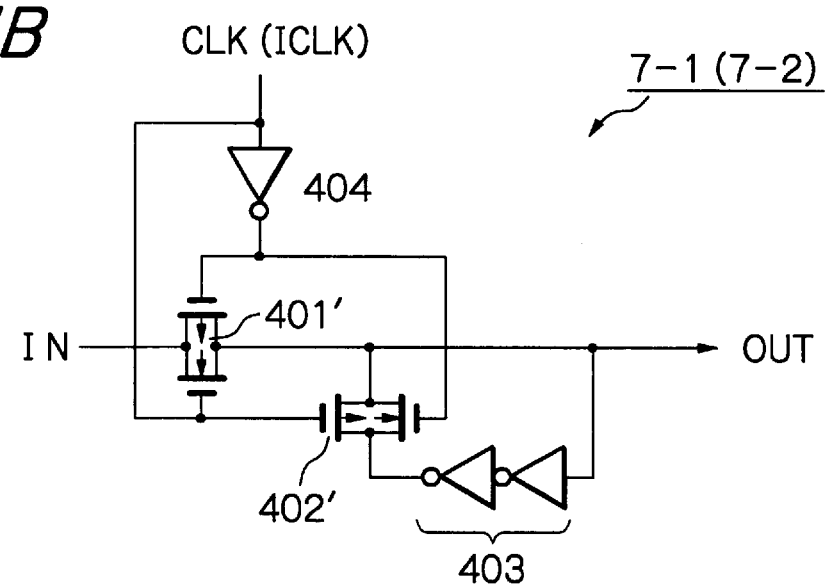

A second example of the latch circuits 7-1 and 7-2 is illustrated in FIG. 4B. In FIG. 4B, the transistor 401 of FIG. 4A is replaced by a CMOS transfer gate 401' and the transistor 402 of FIG. 4A is replaced by a CMOS transfer gate 402'. The operation of the circuit of FIG. 4B is the same as that of the circuit of FIG. 4A.

Figure 4C:
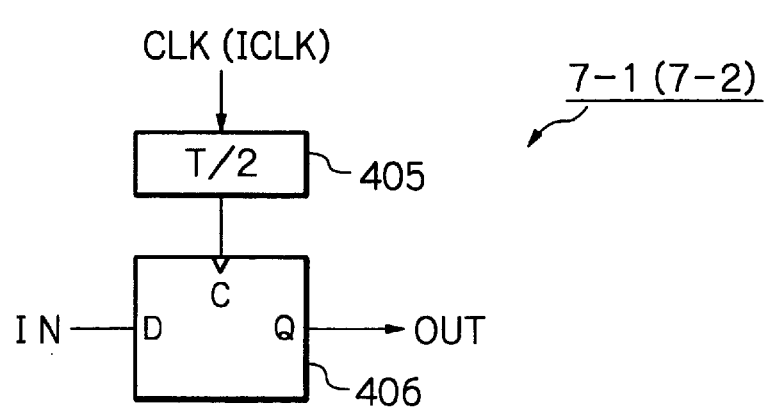

A third example of the latch circuits 7-1 and 72 is illustrated in FIG. 4C. That is, each of the latch circuits 7-1 and 7-2 is constructed by a delay circuit 405 for delaying the clock signal CLK (ICLK) and a D-type flip-flop 406 clocked by the output signal of the delay circuit 405. Therefore, if the delay time of the delay circuit 405 is half of the time period T of the clock signal CLK (ICLK), input data is latched by the D-type flip-flop 406 in accordance with every falling edge of the clock signal CLK (ICLK).

The step-up circuit 8 inverts the output signal S1 of the latch circuit 7-1 and pulls up the inverted signal of the signal S1 to a level $V_H$ higher than the power supply voltage $V_{CC}$ when the output signal S1 falls. For example, $V_H = 2V_{CC} - 2V_{th}$ where $V_{th}$ is a threshold voltage of the N-channel MOS transistor.

Figure 5:
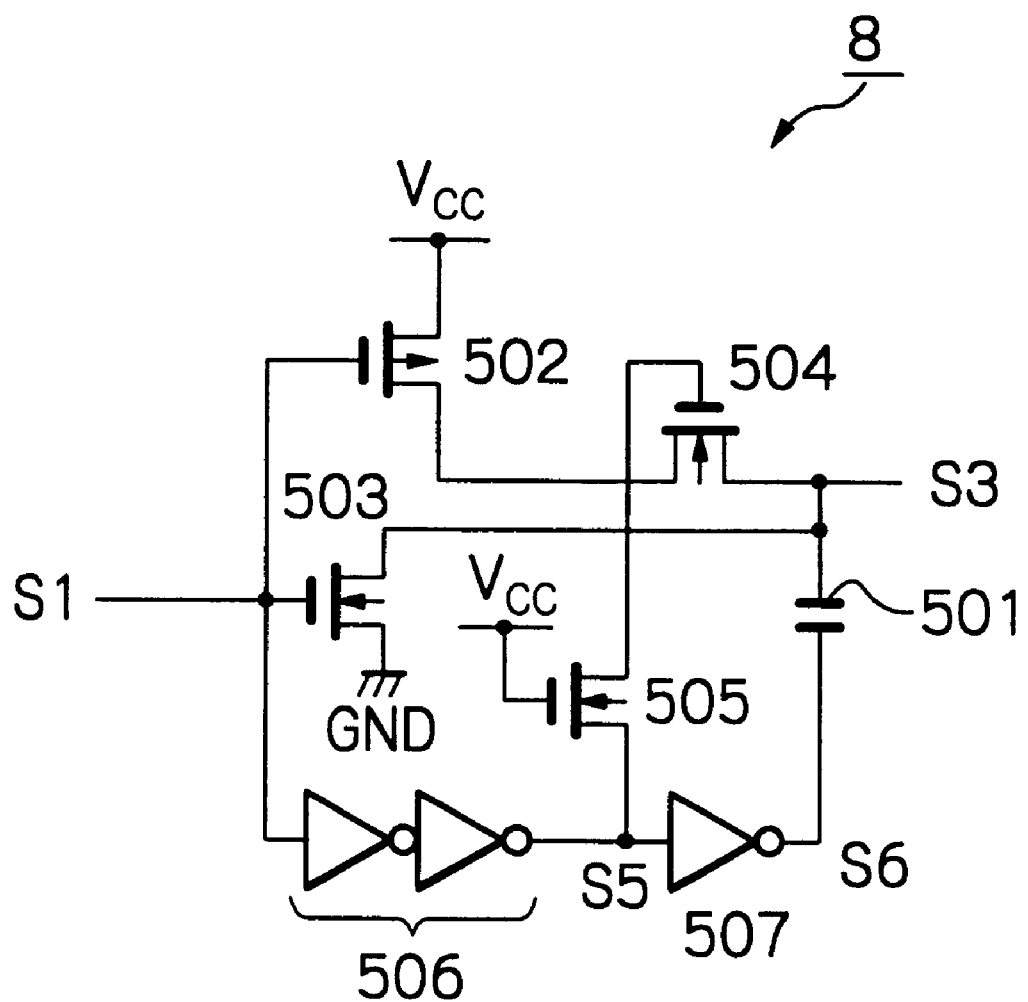
FIG. 5 is a circuit diagram of the step-up circuit of FIG. 3.

An example of the step-up circuit 8 is illustrated in FIG. 5. That is, the step-up circuit 8 is constructed by a capacitor 501, a P-channel MOS transistor 502 for charging the capacitor 501, an N-channel MOS transistor 503 for discharging the capacitor 501, an N-channel MOS transistor 504 for maintaining the charge of the capacitor 501, an N-channel MOS transistor 505 for adjusting the charge maintained in the capacitor 501, a delay circuit 506 and an inverter 507 for carrying out a step-up operation.

The operation of the step-up circuit 8 of FIG. 5 is explained next with reference to FIGS. 6A, 6B, 6C and 6D.

Figure 6:
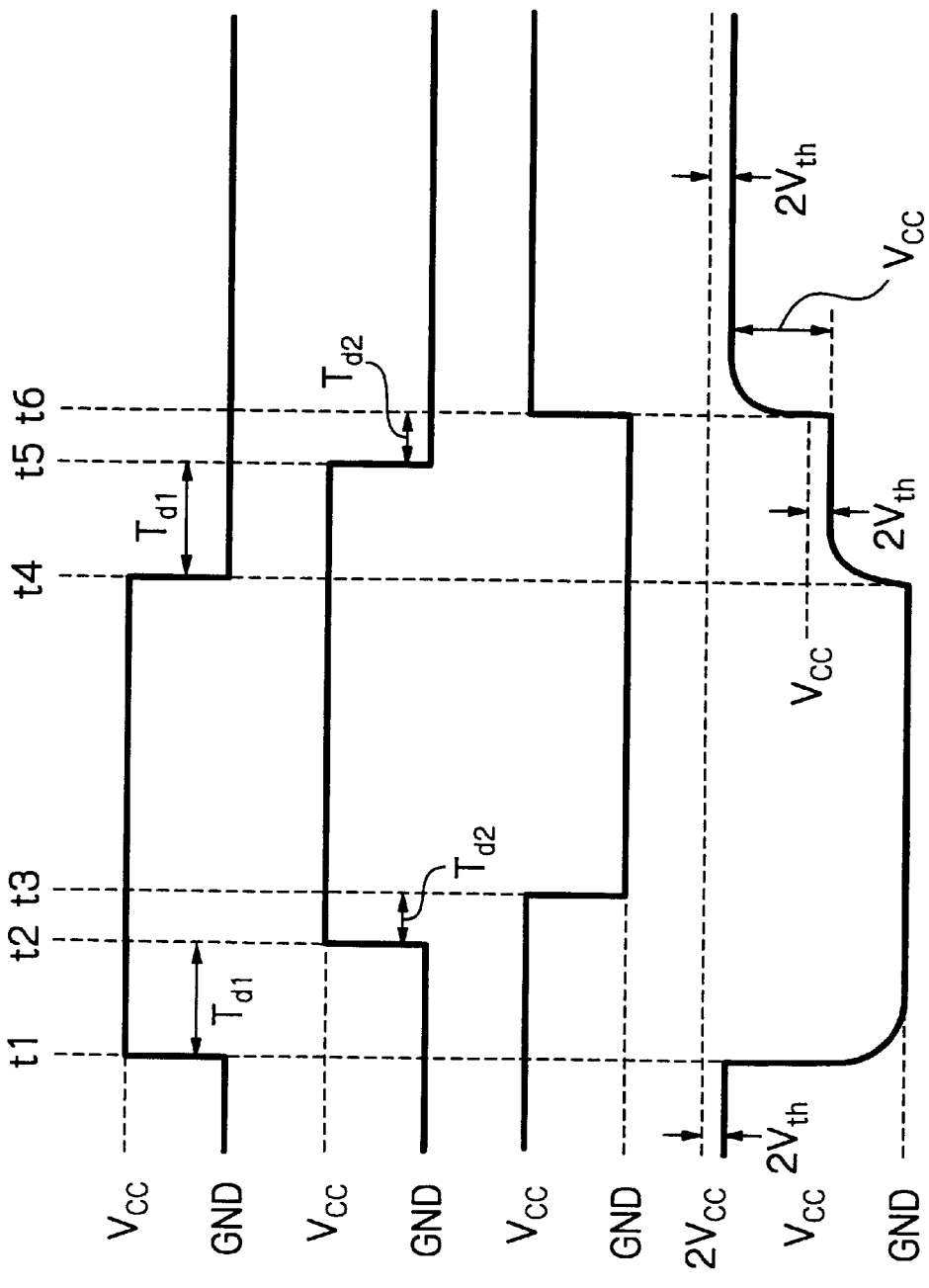
FIGS. 6A, 6B, 6C and 6D are timing diagrams for explaining the operation of the step-up circuit of FIG. 5.

First, at time t1, when the output signal S1 of the latch circuit 7-1 is changed from low (=GND) to high (=$V_{CC}$) as shown in FIG. 6A, the transistors 502 and 503 are turned OFF and ON, respectively, so that the capacitor 501 is discharged to pull down the output signal S3 to GND as shown in FIG. 6D.

Next, when a time period $T_{d1}$ defined by the delay circuit 506 has passed, at time t2, the output signal S5 of the delay circuit 506 is changed from low (=GND) to high (=$V_{CC}$) as shown in FIG. 6B. As a result, the transistor 504 becomes in an ON state. In this case, however, since the transistor 502 is turned OFF, the output signal S3 is unchanged.

Next, when a time period $T_{d2}$ defined by the inverter 507 has passed, at time t3, the output signal S6 of the inverter 507 is changed from high (=$V_{CC}$) to low (=GND) as shown in FIG. 6C. Thus, the voltage difference between the ends of the capacitor 501 is zero, i.e., the output signal S3 is at GND as shown in FIG. 6D.

Next, at time t4, when the output signal S1 of the latch circuit 7-1 is changed from high (=$V_{CC}$) to low (=GND) as shown in FIG. 6A, the transistors 502 and 503 are turned ON and OFF, respectively. In this case, since the transistor 505 is still turned ON by the output signal S5 of the delay circuit 506 to turn ON the transistor 504, the capacitor 501 is charged by the ON state transistor 502. In this case, the gate voltage of the transistor 504 is $V_{CC}-V_{th}$ where $V_{th}$ is a threshold voltage of the transistor 505, so that the output signal S3 is pulled up to $$V_{CC}-2V_{th}$$

Next, when the time period $T_{d1}$ has passed, at time t5, the output signal S5 of the delay circuit 506 is changed from high (=$V_{CC}$) to low (=GND) as shown in FIG. 6B. As a result, the transistor 504 becomes in an OFF state. In this case, since the transistor 503 is turned OFF, the output signal S3 becomes in a floating state.

Finally, when the time period $T_{d2}$ has passed, at time t6, the output signal S6 of the inverter 507 is changed from low (=GND) to high (=$V_{CC}$) as shown in FIG. 6C. Thus, the output signal S3 is further pulled up by $V_{CC}$ due to the bootstrap effect of the capacitor 501, i.e., the output signal S3 is pulled up to $$V_H$$
$$=V_{CC}-2V_{th}+V_{CC}$$
$$=2V_{CC}-2V_{th}$$

Therefore, if $V_{CC}>3V_{th}$, the high voltage $V_H$ (>$V_{CC}+V_{th}$) can completely turn ON the transistor 4'.

The operation of the semiconductor device of FIG. 3 is explained next with reference to FIGS. 7A through 7J.

Figure 7:
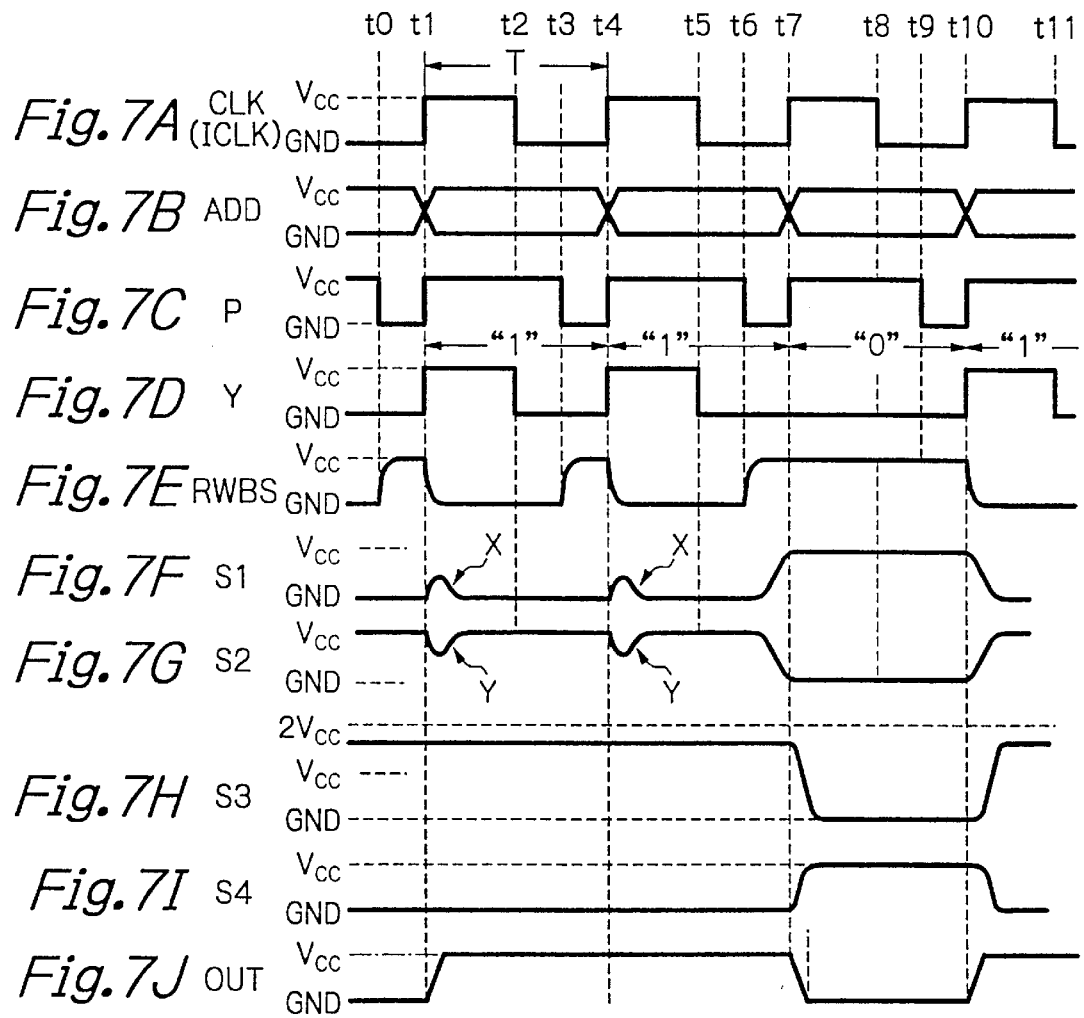
FIGS. 7A through 7J are timing diagrams for explaining the operation of the device of FIG. 3.

As shown in FIG. 7A, the clock signal CLK (ICLK) having the time period T is changed, and as shown in FIG. 7B, address information ADD is changed in synchronization with the clock signal CLK (ICLK). Also, as shown in FIG. 7C, the data bus charging pulse signal P is changed in accordance with the clock signal CLK (ICLK). Further, as shown in FIG. 7D, the cell read data signal Y is generated in synchronization with the high level of the clock signal CLK (ICLK). Here, assume that the cell read data signal Y is changed from "1" via "1" and "0" to "1".

As shown in FIG. 7E, the data bus RWBS is charged by the transistor 1' before the cell read data signal Y is supplied. That is, from time t0 to time t1, from time t3 to time t4, from time t6 to time t7, and from time t9 to time t10, the data bus charging pulse signal P is made low (=GND), so that the transistor 1' is turned ON, thus pulling up the data bus RWBS to $V_{CC}$. Then, the data bus RWBS is discharged in accordance with the cell read data signal Y. For example, at times t1, t4 and t10, since the transistor 2 is turned ON by the high level of the cell read data signal Y, the data bus RWBS is discharged, so that the data bus RWBS is pulled down to GND. On the other hand, at time 7, since the transistor 2 is turned OFF by the low level of the cell read data signal Y, the data bus RWBS remains at the high level.

At times t2, t5, t8, and t11 when the clock signal CLK falls, the latch circuit 7-1 latches the voltage at the data bus RWBS to generate an output signal S1 as shown in FIG. 7F, and the latch circuit 7-2 latches the inverted voltage of the voltage of the data bus RWBS to generate an output signal S2 as shown in FIG. 7G. Thus, even when the cell read data signal Y stays at the same data such as "1" for a plurality of cycles, the output signals S1 and S2 of the latch circuits 7-1 and 7-2 also stay at the same levels.

As shown in FIG. 7H, the step-up circuit 8 generates an output signal S3 which is an inverted signal of the output signal SI of the latch circuit 7-1. In this case, at time t10, when the output signal S1 of the latch circuit 7-1 falls, the output signal S3 of the step-up circuit 8 is boosted to a level $V_H$ higher than $V_{CC}$, thus surely turning ON the transistor 4'. As a result, the voltage at the output terminal OUT becomes $V_{CC}$ as shown in FIG. 7J.

As shown in FIG. 7I, the inverter 10 generates an output signal S4 which is an inverted signal of the output signal S2 of the latch circuit 7-2. In this case, at time t7, when the output signal S2 of the latch circuit 7-2 rises, the output signal S4 of the inverter 10 falls to GND, thus surely turning ON the transistor 5. As a result, the voltage at the output terminal OUT becomes GND as shown in FIG. 7J.

In the semiconductor memory device of FIG. 3, since the transistor 4' of the push-pull type output circuit on the power supply terminal $V_{CC}$ is of an N-channel type, the pulling up drive ability of the transistor 4' is so large that the read operation speed can be low. Note that the drive ability of the transistor 4' can be increased without increasing the transistor 4' in size, which would suppress the increase of the device of FIG. 3 in size.

Also, in the semiconductor memory device of FIG. 3, even when the cell read data signal Y stays at the same data such as "1" for a plurality of cycles, the voltage at the output terminal OUT stays at the high level $V_{CC}$. In this case, the transistor 4' is hardly switched ON and OFF, which would suppress the increase of the power consumption.

Further, in the semiconductor memory device of FIG. 3, even when the cell read data signal Y is high (=$V_{CC}$), the transistor 1' becomes in an ON-state only immediately before the rising of the clock signal CLK (ICLK), which also would decrease the power consumption.

Note that, as shown in FIG. 7F, after times t1 and t4, since the data bus RWBS is still being discharged, hazard waves as indicated by X are generated in the output signal S1 of the latch circuit 7-1. In this case, if the hazard waves have a small time duration or a small amplitude, the transistor 503 of the step-up circuit 8 is hardly turned ON, so that the output signal S3 of the step-up circuit 8 remains at the high level (=$V_{CC}$).

Similarly, as shown in FIG. 7G, after times t1 and t4, since the data bus RWBS is still being discharged, hazard waves as indicated by Y are generated in the output signal S2 of the latch circuit 7-2. In this case, if the hazard waves have a small time duration or a small amplitude, the N-channel MOS transistor 503 of the inverter 10 is hardly turned ON, so that the output signal S4 of the inverter 10 remains at the low level (=GND).

Figure 8:
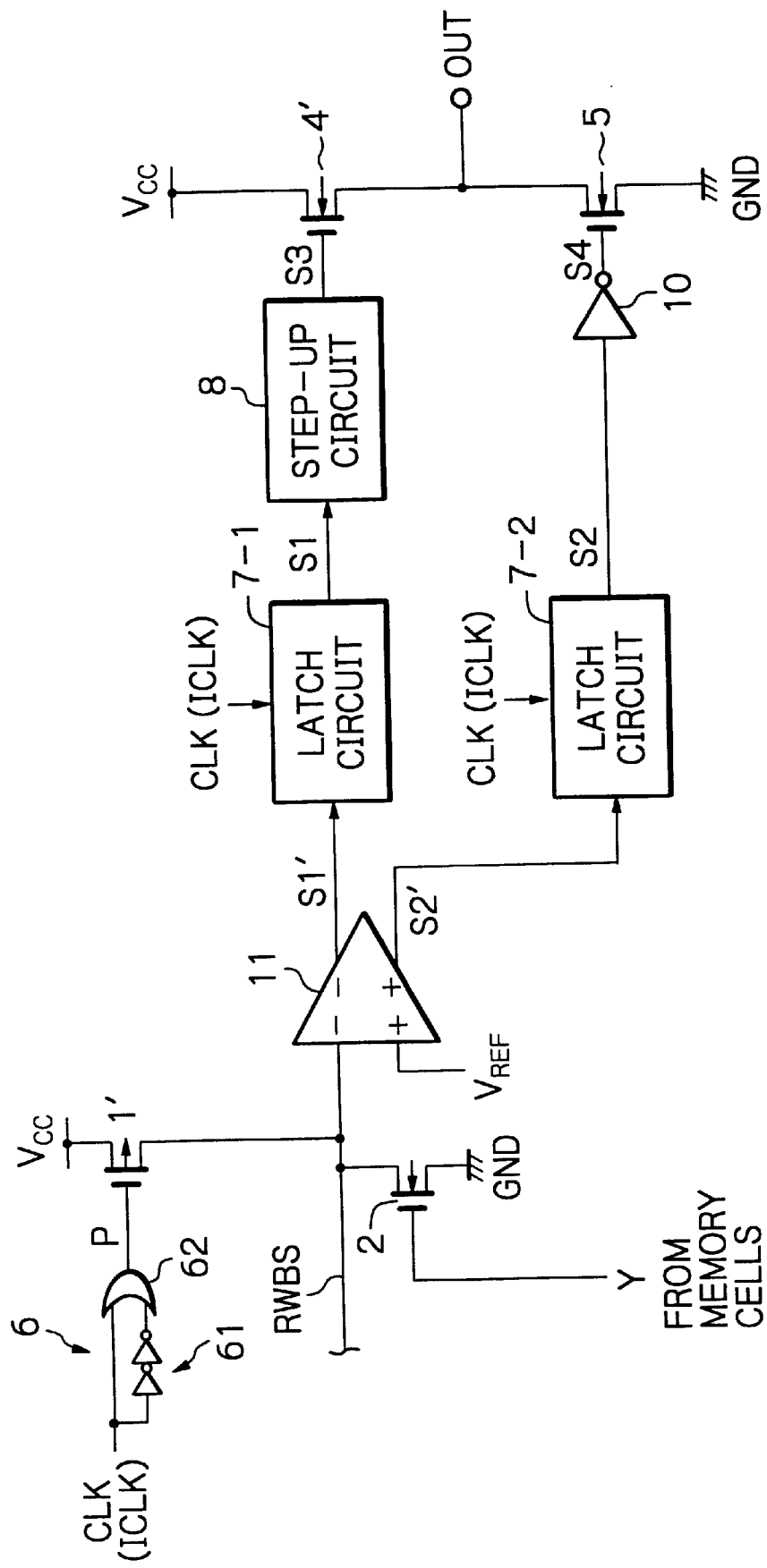
FIG. 8 is a circuit diagram illustrating a second embodiment of the semiconductor memory device according to the present invention.
Figure 9:
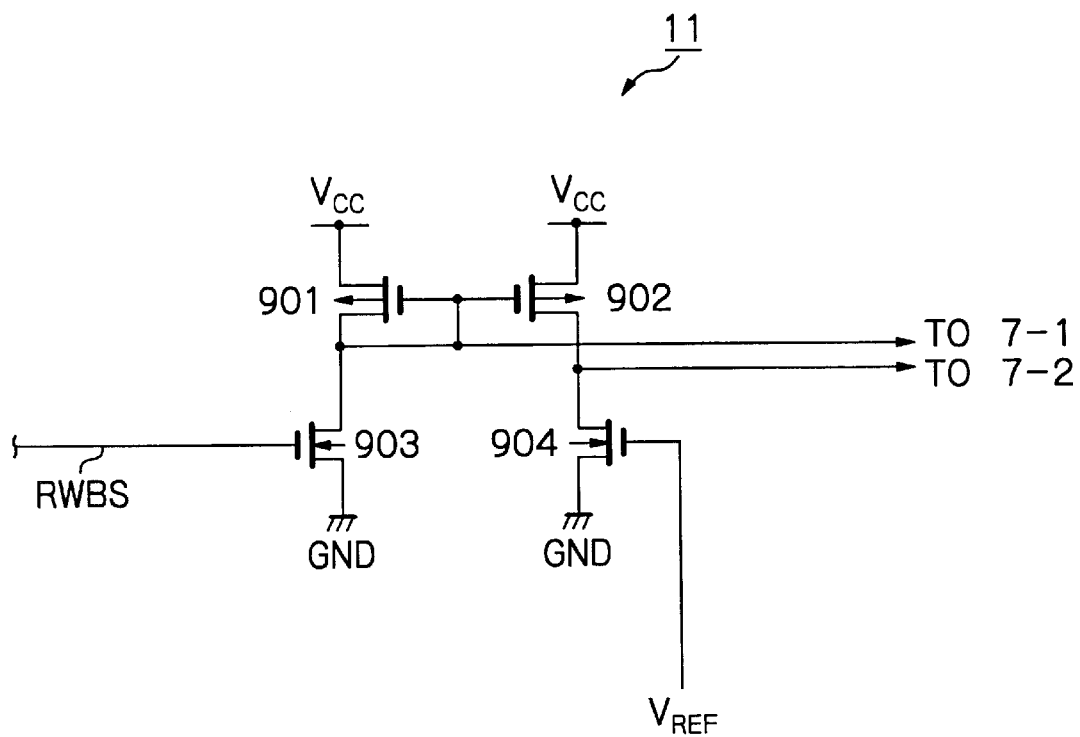
FIG. 9 is a detailed circuit diagram of the comparator of FIG. 8.

In FIG. 8, which illustrates a second embodiment of the present invention, a comparator 11 is connected between the data bus RWBS and the latch circuits 7-1 and 7-2 of FIG. 3. Since the comparator 11 also serves as the inverter 9 of FIG. 3, the inverter 9 of FIG. 3 is omitted from FIG. 8. The comparator 11 is constructed by a differential amplifier of a current mirror type as illustrated in FIG. 9. As illustrated in FIG. 9, the comparator 11 is formed by P-channel MOS transistors 901 and 902 having a common gate and a common source connected to the power supply terminal $V_{CC}$, an N-channel MOS drive N-channel MOS transistor 903 connected between the drain (gate) of the transistor 901 and the ground terminal GND, and an N-channel MOS transistor 904 connected between the drain of the transistor 902 and the ground terminal GND. In this case, the gate of the transistor 903 is connected to the data bus RWBS, while a reference voltage $V_{REF}$ is applied to the gate of the transistor 904. Also, the drains of the transistors 901 and 903 are connected to the latch circuit 7-1, and the drains of the transistors 902 and 904 are connected to the latch circuit 7-2. Thus, the comparator 11 amplifies the difference between the voltage at the data bus RWBS and the reference voltage $V_{REF}$ to generate output signals S1' and S2' and supply the output signals S1' and S2' to the latch circuits 7-1 and 7-2, respectively. That is, if $V_{RWBS} \geq V_{REF}$)

$V_{S1}$=GND $V_{S2}$=$V_{CC}$ where $V_{RWBS}$ is the voltage at the data bus RWBS;
$V_{S1}$ is the voltage of the output signal S1'; and
$V_{S2}$ is the voltage of the output signal S2'. On the other hand, if $V_{RWBS} < V_{REF}$, $V_{S1}$=$V_{CC}$ $V_{S2}$=GND Since each of the output signals S1' and S2' of the comparator 11 clearly shows $V_{CC}$ or GND, the hazard waves as shown in FIGS. 7F and 7G are hardly generated in the output signals St and S2 of the latch circuits 7-1 and 7-2.

Figure 10:
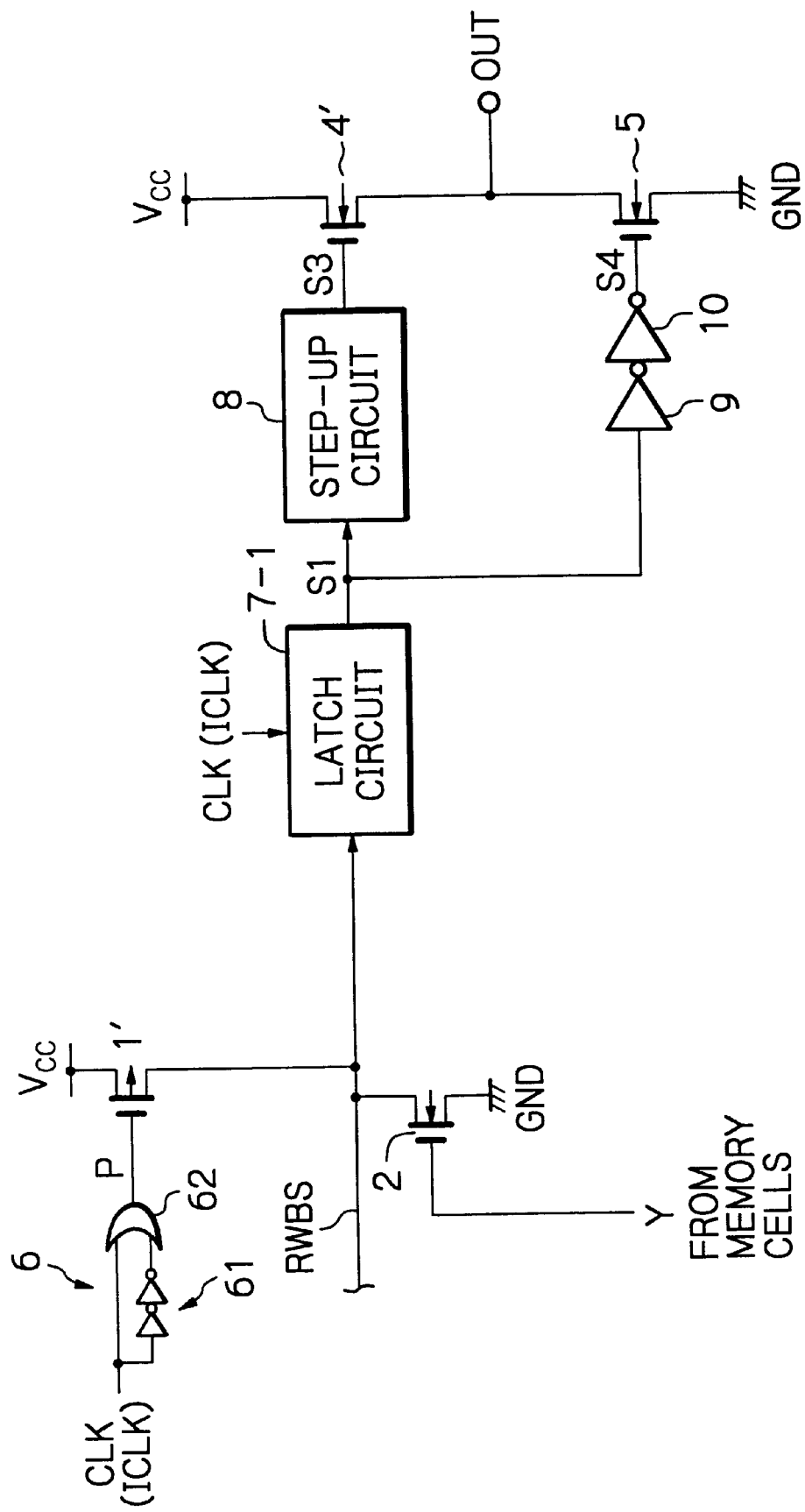
FIG. 10 is a circuit diagram illustrating a third embodiment of the semiconductor memory device according to the present invention.

In FIG. 10, which illustrates a third embodiment of the present invention, the latch circuit 7-2 of FIG. 3 is omitted, and the output signal S1 of the latch circuit 7-1 is supplied via the inverter 9 to the inverter 10. The operation of the circuit of FIG. 10 is the same as that of the circuit of FIG. 3. Since the latch circuit 7-2 of FIG. 3 is omitted, the device of FIG. 10 can be reduced in size as compared with the device of FIG. 3.

Figure 11:
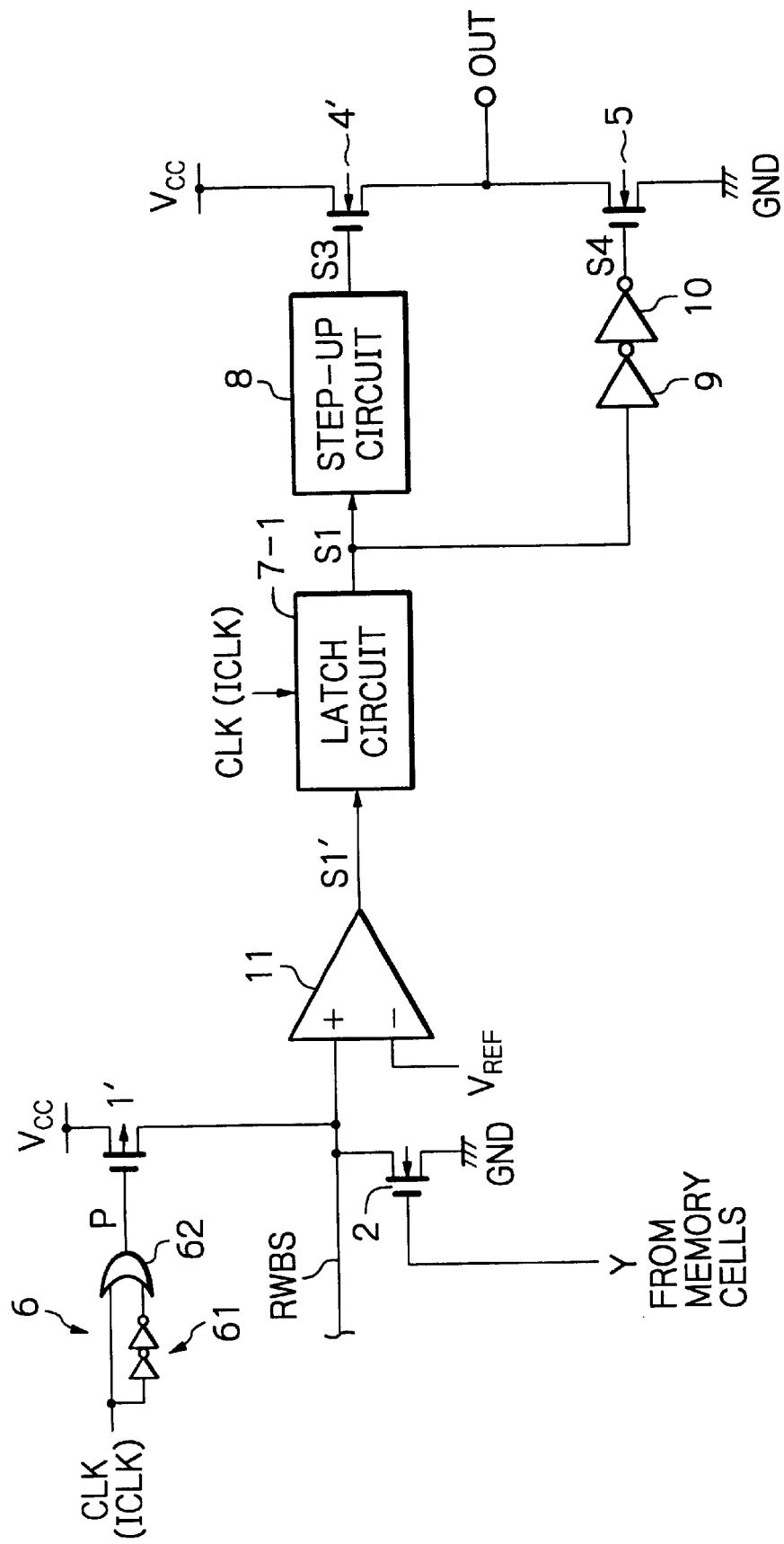
FIG. 11 is a circuit diagram illustrating a fourth embodiment of the semiconductor memory device according to the present invention.

In FIG. 11, which illustrates a fourth embodiment of the present invention, a comparator 11 is connected between the data bus RWBS and the latch circuit 7-1 of FIG. 10. Thus, the comparator 11 amplifies the difference between the voltage at the data bus RWBS and the reference voltage $V_{REF}$ to generate an output signal S1' and supply the output signal S1' to the latch circuit 7-1. Therefore, since the output signal S1' of the comparator 11 clearly shows $V_{CC}$ or GND, the hazard waves as shown in FIG. 7F are hardly generated in the output signal Si of the latch circuit 7-1.

In FIGS. 12, 13, 14 and 15, which illustrate fifth, sixth, seventh and eighth embodiments, respectively, of the present invention, the devices of FIGS. 3, 8, 10 and 11 are modified so that the cell read data signal Y is inverted by an inverter 21 and is then supplied to the gate of the transistor 2.

Figure 12:
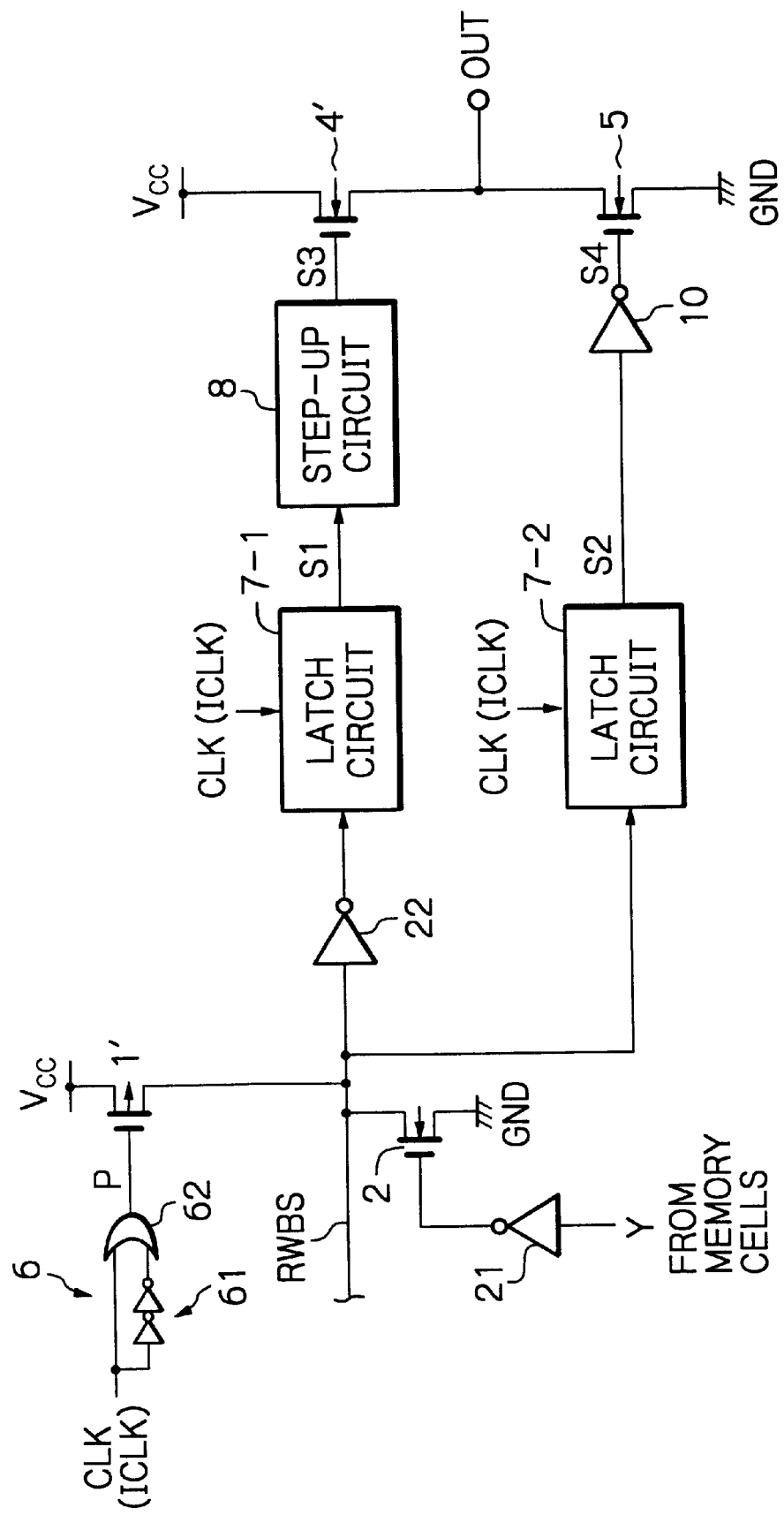
FIG. 12 is a circuit diagram illustrating a fifth embodiment of the semiconductor memory device according to the present invention.
Figure 14:
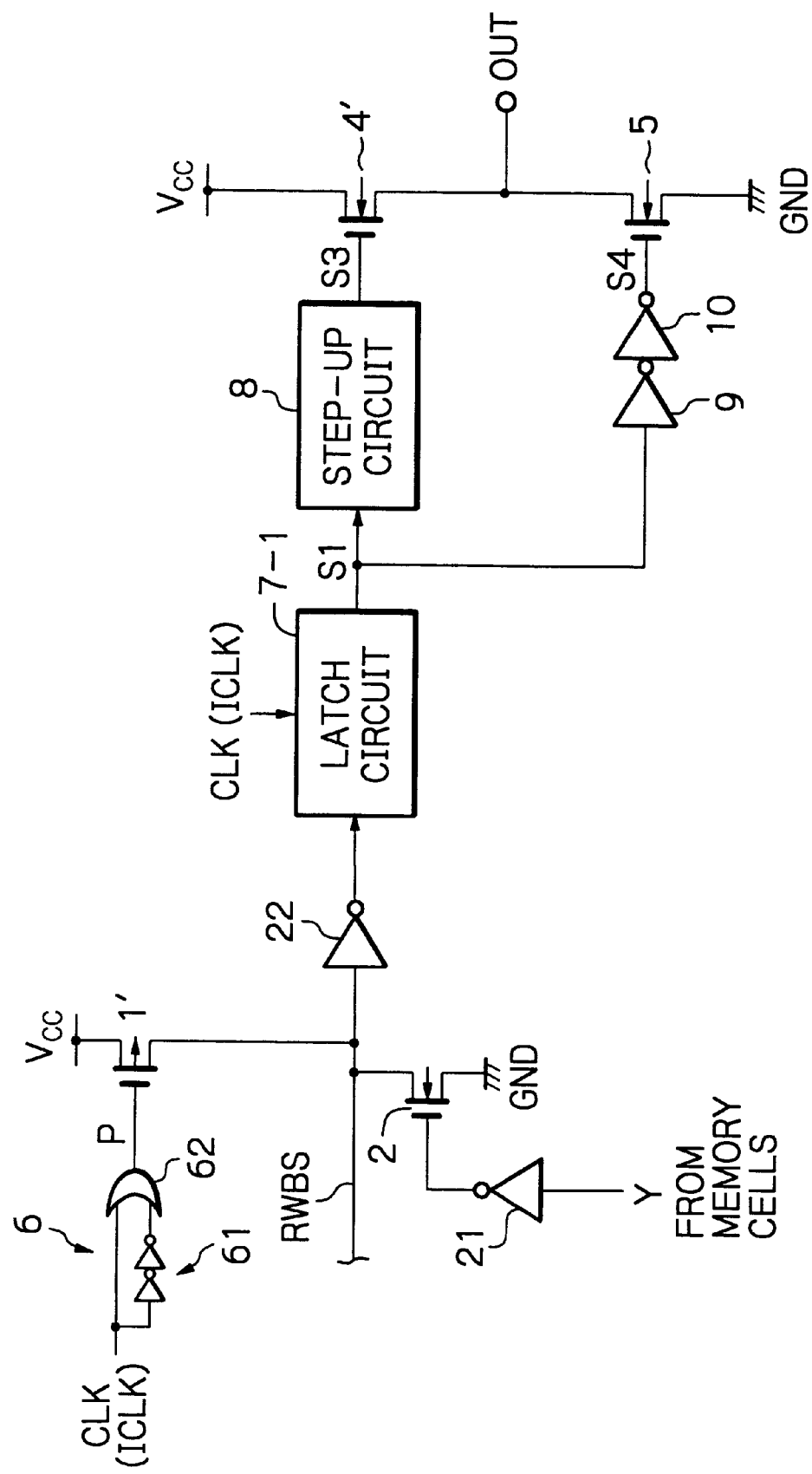
FIG. 14 is a circuit diagram illustrating a seventh embodiment of the semiconductor memory device according to the present invention.

Also, in FIGS. 12 and 14, an inverter 22 is connected between the data bus RWBS and the latch circuit 7-1, and the inverter 9 of FIGS. 3 and 10 is omitted.

Figure 13:
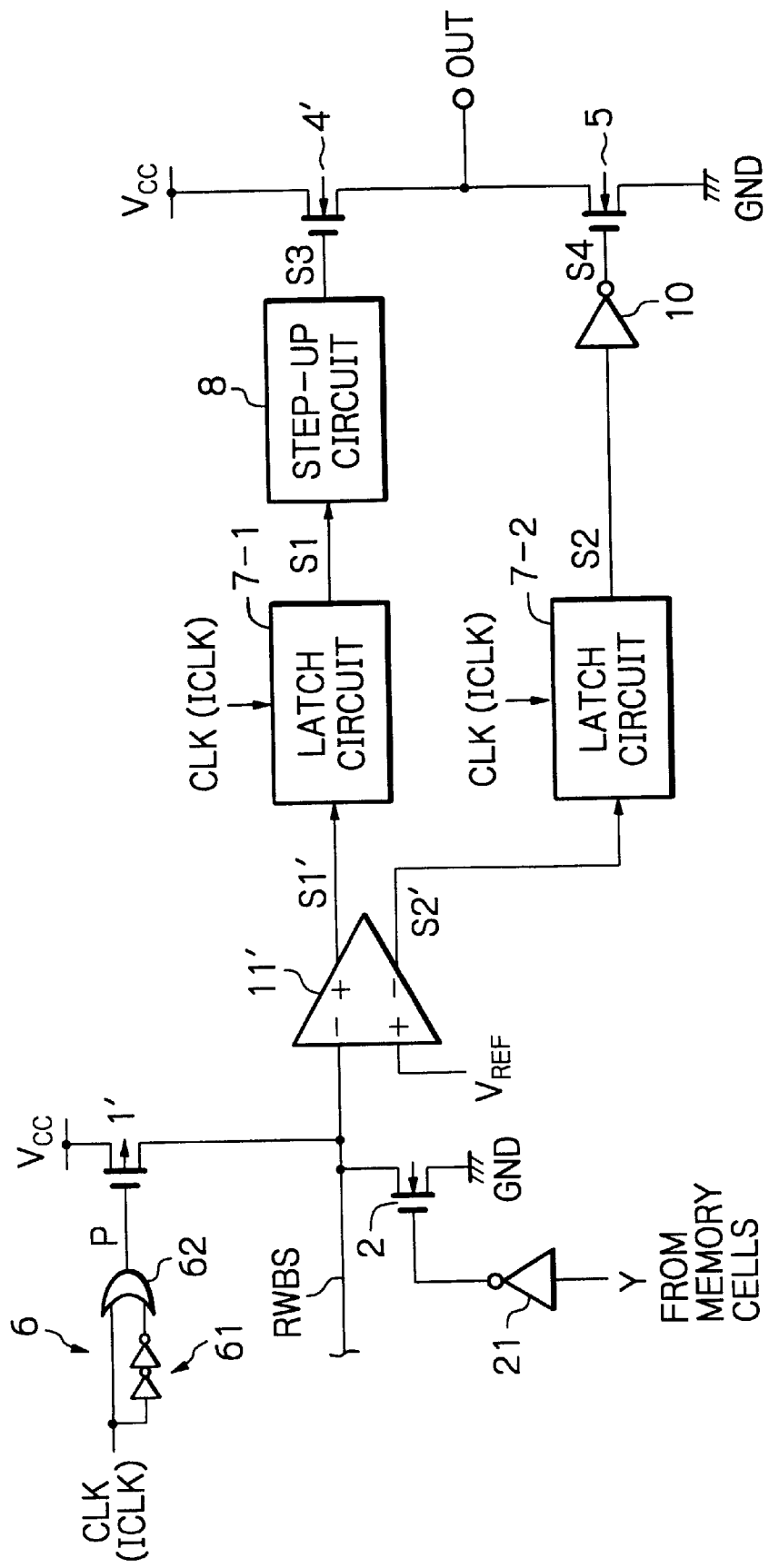
FIG. 13 is a circuit diagram illustrating a sixth embodiment of the semiconductor memory device according to the present invention.

Further, in FIG. 13, the comparator 11 of FIG. 8 is modified to a comparator 11' whose output signals S1' and S2' are opposite in phase to those of the comparator 11 of FIG. 8.

Figure 15:
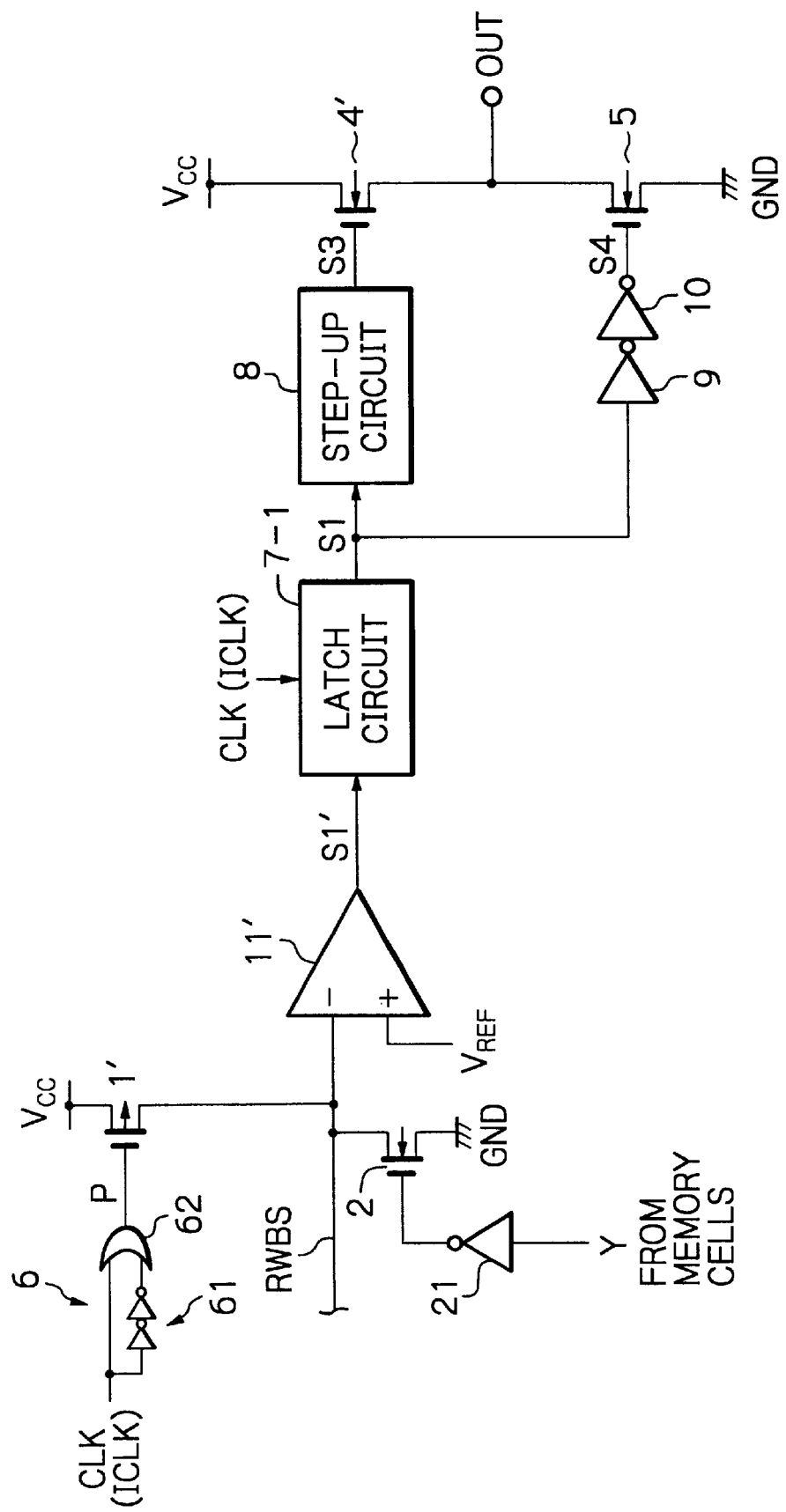
FIG. 15 is a circuit diagram illustrating an eighth embodiment of the semiconductor memory device according to the present invention.

Still further, in FIG. 15, the comparator 11 of FIG. 11 is modified to a comparator 11' whose output signal S1' is opposite in phase to that of the comparator 11 of FIG. 11.

As explained hereinabove, according to the present invention, since the transistor of the push-pull type output circuit on the power supply terminal is of an N-channel type, the pulling up drive ability of the power supply terminal side transistor is so large that the read operation speed can be high. Also, even when the cell read data signal stays at the same data such as "1" for a plurality of cycles, the output voltage stays at the same level, which would suppress the increase of the power consumption. Further, since a charging transistor for charging the data bus is turned ON only immediately before the rising of the clock signal, the power consumption can also be decreased.

What is claimed is:

1. A semiconductor memory device comprising:
   a first power supply terminal for receiving a first power supply voltage;
   a second power supply terminal for receiving a second power supply voltage lower than said first power supply voltage;
   a data bus;
   a data bus charging circuit, connected between said first power supply terminal, for charging said data bus;
   a data bus discharging circuit, connected between said data bus and said second power supply terminal, for discharging said data bus in accordance with a cell read data signal;
   an output terminal;
   a push-pull type output circuit formed by a first N-channel MOS transistor connected between said first power supply terminal and said output terminal and a second N-channel MOS transistor connected between said output terminal and said second power supply terminal; and
   a step-up circuit, connected between said data bus and a gate of said first N-channel MOS transistor, for generating a step-up voltage higher than said first power supply voltage in accordance with a voltage at said data bus, said step-up voltage being applied to the gate of said first N-channel MOS transistor, said second N-channel MOS transistor being controlled by the voltage at said data bus.

2. The device as set forth in claim 1, wherein said step-up circuit generates said step-up voltage when an input voltage to said step-up circuit falls.

3. The device as set forth in claim 1, further comprising:
   a first latch circuit, connected between said data bus and said step-up circuit, for latching the voltage at said data bus in accordance with a clock signal, said cell read data signal being in synchronization with said clock signal;
   a first inverter connected to said data bus;
   a second latch circuit, connected to said first inverter, for latching the output voltage of said first inverter in accordance with said clock signal; and a second inverter, connected between said second latch circuit and a gate of said second N-channel MOS transistor.

4. The device as set forth in claim 1, further comprising:

a comparator, connected to said data bus, for comparing the voltage at said data bus with a reference voltage to generate first and second comparison signals opposite in phase;

a first latch circuit, connected between said comparator and said step-up circuit, for latching said first comparison signal in accordance with a clock signal, said cell read data signal being in synchronization with said clock signal;

a second latch circuit, connected to said comparator, for latching said second comparison signal in accordance with said clock signal; and an inverter, connected between said second latch circuit and a gate of said second N-channel MOS transistor.

5. The device as set forth in claim 1, further comprising:

a latch circuit, connected between said data bus and said step-up circuit, for latching the voltage at said data bus in accordance with a clock signal, said cell read data signal being in synchronization with said clock signal; and a buffer, connected between said latch circuit and a gate of said second N-channel MOS transistor.

6. The device as set forth in claim 1, further comprising:

a comparator, connected to said data bus, for comparing the voltage at said data bus with a reference voltage ($V_{REF}$) to generate a comparison signal;

a latch circuit, connected between said comparator and said step-up circuit, for latching the voltage at said comparison signal in accordance with a clock signal, said cell read data signal being in synchronization with said clock signal; and a buffer, connected between said latch circuit and a gate of said second N-channel MOS transistor.

7. The device as set forth in claim 1, wherein said data bus charging circuit charges said data bus in accordance with a data bus charging pulse signal generated in accordance with a clock signal, said cell read data signal being in synchronization with said clock signal.

8. The device as set forth in claim 1, further comprising:

a first inverter, connected to an input of said data bus charging circuit, for inverting said cell read data signal;

a second inverter connected to said data bus;

a first latch circuit, connected between said second inverter and said step-up circuit, for latching the voltage at said data bus in accordance with a clock signal, said cell read data signal being in synchronization with said clock signal;

a second latch circuit, connected to said data bus, for latching the voltage at said data bus in accordance with said clock signal; and a third inverter, connected between said second latch circuit and a gate of said second N-channel MOS transistor.

9. The device as set forth in claim 1, further comprising:

a first inverter, connected to an input of said data bus charging circuit, for inverting said cell read data signal;

a comparator, connected to said data bus, for comparing the voltage at said data bus with a reference voltage to generate first and second comparison signals opposite in phase;

a first latch circuit, connected between said comparator and said step-up circuit, for latching said first comparison signal in accordance with a clock signal, said cell read data signal being in synchronization with said clock signal;

a second latch circuit, connected to said comparator, for latching said second comparison signal in accordance with said clock signal; and a second inverter, connected between said second latch circuit and a gate of said second N-channel MOS transistor.

10. The device as set forth in claim 1, further comprising:

a first inverter, connected to an input of said data bus charging circuit, for inverting said cell read data signal;

a second inverter, connected to said data bus;

a latch circuit, connected between said second inverter and said step-up circuit, for latching the output voltage of said second inverter in accordance with a clock signal, said cell read data signal being in synchronization with said clock signal; and a buffer, connected between said latch circuit and a gate of said second N-channel MOS transistor.

11. The device as set forth in claim 1, further comprising:

an inverter, connected to an input of said data bus charging circuit, for inverting said cell read data signal;

a comparator, connected to said data bus, for comparing the voltage at said data bus with a reference voltage to generate a comparison signal;

a latch circuit, connected between said comparator and said step-up circuit, for latching the voltage at said comparison signal in accordance with a clock signal, said cell read data signal being in synchronization with said clock signal; and a buffer connected between said latch circuit and a gate of said second N-channel MOS transistor.

* * * * *